(12) United States Patent
Ohtsuka et al.

(10) Patent No.: US 6,859,381 B2
(45) Date of Patent: Feb. 22, 2005

(54) SEMICONDUCTOR DEVICE AND METHOD FOR DRIVING THE SAME

(75) Inventors: Takashi Ohtsuka, Osaka (JP); Kiyoyuki Morita, Kyoto (JP); Michihito Ueda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/791,781

(22) Filed: Mar. 4, 2004

(65) Prior Publication Data

US 2004/0165430 A1 Aug. 26, 2004

Related U.S. Application Data

(62) Division of application No. 09/977,310, filed on Oct. 16, 2001, now Pat. No. 6,720,596.

(30) Foreign Application Priority Data

Oct. 17, 2000 (JP) ..................................... 2000-316149

(51) Int. Cl.[7] .............................................. G11C 11/22
(52) U.S. Cl. .................................. 365/145; 365/189.04
(58) Field of Search ........................... 365/145, 189.04, 365/189.09, 149; 295/295

(56) References Cited

U.S. PATENT DOCUMENTS

| | | | |
|---|---|---|---|
| 5,345,414 A | * | 9/1994 | Nakamura .................. 365/145 |
| 5,559,733 A | | 9/1996 | McMillan et al. |
| 5,625,211 A | | 4/1997 | Kowshik |
| 5,629,888 A | * | 5/1997 | Saito et al. .................. 365/145 |
| 5,910,911 A | * | 6/1999 | Sekiguchi et al. .......... 365/145 |
| 5,949,706 A | | 9/1999 | Chang et al. |
| 6,025,650 A | | 2/2000 | Tsuji et al. |
| 6,040,610 A | | 3/2000 | Noguchi et al. |
| 6,191,441 B1 | | 2/2001 | Aoki et al. |
| 6,370,056 B1 | * | 4/2002 | Chen et al. .................. 365/145 |
| 6,385,076 B1 | | 5/2002 | Fujimori |

FOREIGN PATENT DOCUMENTS

| | | |
|---|---|---|
| JP | 06104447 A | 4/1994 |
| JP | 2000-138351 A | 5/2000 |
| JP | 2000-331484 A | 11/2000 |

* cited by examiner

*Primary Examiner*—Anh Phung
(74) *Attorney, Agent, or Firm*—McDermott Will & Emery LLP

(57) ABSTRACT

A nonvolatile semiconductor storage element, which is provided with a floating gate electrode, and a dielectric capacitor and a ferroelectric capacitor both connected to the floating gate electrode. By applying voltage between a first polarization voltage supplying terminal and a second polarization voltage supplying terminal, polarization serving as information is generated in the ferroelectric film of the ferroelectric capacitor. Additionally, when a read-out voltage is applied between the ground terminal and the power source voltage terminal that are in connection with the source and drain regions, the MISFET is turned either on or off in correspondence to the state of the charge held in the floating gate electrode, and thus information within the floating gate electrode is read out.

2 Claims, 9 Drawing Sheets

SEMICONDUCTOR DEVICE AND METHOD FOR DRIVING THE SAME

This is a division of Application Ser. No. 09/977,310, filed Oct. 16, 2001, now U.S. Pat. No. 6,720,596 issued Apr. 3, 2004.

BACKGROUND OF THE INVENTION

The present invention relates to a nonvolatile memory cell and a logic element device that use a ferroelectric layer.

Nonvolatile memories have become indispensable devices in conjunction with the recent miniaturization of devices and advances in portable devices. Flash memories and ferroelectric memories (FRAM) are nonvolatile memories that have already made their way into the market. In particular, miniaturized nonvolatile memories capable of high-speed operation have been proposed that use ferroelectrics for a portion of the insulating film, such as the gate insulating film, of a MISFET (metal insulator semiconductor field effect transistor). MISFETs using such a ferroelectric layer include MFISFETs using electrodes (M), ferroelectric layers (F), insulating layers (I) made from a regular dielectric material and Si substrates (S), and MFMISFETs using upper electrodes (M), ferroelectrics (F), middle electrodes (M), and gate insulating films (I) made of a regular dielectric material. In the present specification, these are referred to generically as MFS-type FETs.

In MFS-type FETs, the polarization of the ferroelectric is changed by applying a voltage of at least the coercive voltage of the ferroelectric, between the semiconductor substrate and the electrode sandwiching the ferroelectric layer, and the remanent polarization that remains in the ferroelectric after the removal of voltage puts the MISFET into a normal ON or a normal OFF state, which is stored as the information "0" or "1." Using these polarization holding properties of ferroelectrics, MFS-type FETs are being studied for applicability as elements that require non-volatility and that are used as the nodes of memories or FPGAs, for example.

One example of an MFS-type FET is disclosed in JP 2000-138351A, in which a device has been proposed that includes two ferroelectric capacitors that are connected to the gate electrode of a field effect transistor.

On the other hand, in general, functional elements such as inverters (INV) and flip flops (FF) are used widely as semiconductor circuit elements.

FIG. 12 is an electric circuit diagram showing the configuration of an ordinary inverter circuit. FIG. 13 is a cross-sectional view showing the structure of a CMOS device configuring an ordinary inverter circuit.

As shown in FIG. 12 and FIG. 13, an ordinary inverter circuit includes an n-channel MISFET (nMISFET) and a p-channel MISFET (pMISFET) arranged in series between the terminal supplying power source voltage VDD and the terminal supplying ground voltage Vss. Moreover, it is configured such that an input signal Sin is input to the gate electrodes of the nMISFET and the pMISFET, and an output signal Sout is output from the source and drain regions of the nMISFET and pMISFET.

As shown in FIG. 13, a semiconductor substrate 101 that has been doped with p-type impurities is provided with an n-well 102. The nMISFET is disposed in the p-type region, whereas the pMISFET is disposed in the n-well 102. The nMISFET is provided with a gate insulating film 105 made of $SiO_2$, a gate electrode 106 provided on the gate insulating film 105, and source and drain regions 103a and 103b that are formed at both sides of the gate electrode 106 within the Si substrate 101. The pMISFET is provided with a gate insulating film 107 made of $SiO_2$, a gate electrode 108 formed on the gate insulating film 107, and source and drain regions 104a and 104b that are formed at both sides of the gate electrode 108 within the n-well 102. Additionally, a node 111, which is on the source region 103a of the nMISFET, receives the ground voltage Vss, and a node 112, which is on the source region 104b of the pMISFET, receives the power source voltage VDD. Moreover, the input signal Sin is inputted into the gate electrodes 105 and 108 of the MISFETs, and the output signal Sout is outputted from a node 113, which is provided spanning between the drain region 103b of the nMISFET and the drain region 104a of the pMISFET.

FIG. 14 is an equivalent circuit diagram showing the configuration of an ordinary flip-flop circuit. As shown in the diagram, a flip-flop FF is configured by the combination of numerous nMISFETs and pMISFETs, and has the function of holding input data. As such, flip-flops FF have numerous applications, for example, they are used as the basic cells of SRAMs.

However, to store data, FFs include portions in which inverters are connected in series and to apply feedback, and moreover FFs are volatile, so that the stored data is erased when the power source is removed.

As a countermeasure, as disclosed in JP H05-250881A and JP 2000-77986A, for example, a non-volatile flip-flop circuit has been proposed in which an MFS-type element is used instead of the MISFETs in the flip-flop circuit, in order to remedy volatility.

The above-mentioned conventional technologies, however, have encountered the following problems.

Conventional MFS-type FETs have an insulating layer I, which is made of a regular dielectric material, and a ferroelectric layer F, deposited in that order. Therefore, when voltage is applied to the gate electrode to reverse the polarization of the ferroelectric layer F, the applied voltage is distributed between the ferroelectric layer F and the insulating layer I, with the amount of distribution of voltage to the ferroelectric layer F being determined by the ratio of the capacitance Ci of the insulating layer I to the capacitance Cf of the ferroelectric layer F.

This means, to generate a reversal in polarization of the ferroelectric layer F, it is necessary to make the capacity Cf of the ferroelectric layer F small. However, charge must be induced that generates a threshold shift in the insulating layer I depending on the polarization of the ferroelectric layer F, so that physical values such as the remanent polarization of the ferroelectric material, physical values such as the induction rate and the film thickness of the insulating material, as well as the ratio of the area of the insulating layer I to the ferroelectric layer F, and the thickness of the ferroelectric layer F are adjusted. In MFISFETs, however, voltage is applied for creating polarization between the semiconductor substrate and the gate electrode, so depending on the structure of the semiconductor substrate, structural or operational problems may occur, such as a depletion layer becoming sandwiched between the portion of the semiconductor substrate to which voltage is applied and the gate electrode, or the total capacity being easily affected by the potential of the source region and the drain region.

FIG. 11 is a graph showing the results of a simulation of the drain current Id as a function of the gate voltage Vg of an MFS-type FET taking the area ratio AR (=area of the insulation layer I/area of the ferroelectric layer F) as a parameter. As shown in the graph, when a large area ratio AR is taken to increase the amount of voltage distributed to the ferroelectric layer F, it can be seen that the saturation drain current decreases. That is, because the insulating layer I and the ferroelectric layer F being used are arranged in series, the total capacity between the gate electrode and the semiconductor substrate is reduced, and in comparison to a case in which the gate insulating film is made up of only the insulating layer I, the saturation drain current is reduced. Consequently, in order to secure sufficient saturation drain current it is necessary to increase the size of the FET.

On the other hand, when writing to an MFS-type FET, the voltage that is required to reverse the polarization between the gate electrode and the semiconductor substrate is applied, and when reading out from an MFS-type FET, a voltage not higher than the writing voltage is applied between the gate electrode and the semiconductor substrate. When reading out, even if the voltage applied to the ferroelectric layer F is not higher than the coercive voltage, a portion of the polarization becomes reversed due to the a minor hysteresis loop of the ferroelectric. This phenomenon is called read disturb, and when multiple read-outs are repeated, the ability to obtain the threshold shift necessary for a read-out is lost.

Among MFS-type FETs, with MFISFETs and MFMISFETs, operations such as reading out while writing were difficult because the same gate electrode is used for reading out and writing.

Furthermore, the MFMISFET mentioned in JP 2001-38351A is made of two ferroelectric capacitors connected in parallel to the gate electrode of a MISFET, so to generate a potential in the gate electrode necessary for a threshold shift, it is necessary to intricately adjust the size of the ferroelectric capacitors and the film thickness of the ferroelectric, and there are processing difficulties and problems in the reduction of the cell area. Additionally, during the read-out, a voltage is applied to only one of the two ferroelectric capacitors arranged in parallel, so although read disturb is reduced, in terms of percentage it is reduced to only half. Also, operations such as writing to the ferroelectric layer F while reading out information cannot be achieved.

On the other hand, the flip-flop circuit disclosed in JP H05-250881 simply replaces the MISFETs of an ordinary flip-flop circuit with MFS-type FETs, and the flip-flop circuit disclosed in JP 2000-77986A simply replaces the MISFETs of an ordinary master-slave flip-flop with MFS-type FETs. Consequently, these proposals require the same number of FETs as normal flip-flop circuits, and have the problem that it is necessary to change the writing voltage, and that the scale of the circuit increases.

SUMMARY OF THE INVENTION

A first object of the present invention is to provide an MFS-type FET in which there is little read disturb and a saturation drain current can be secured easily, and furthermore with which read-out and writing can be performed in parallel.

A second object of the present invention is to provide a logic circuit, for example a flip-flop, that has a simple configuration using a small number of elements.

A semiconductor device of the present invention includes a semiconductor substrate; a gate insulating film formed on the semiconductor substrate; a floating gate electrode formed on the gate insulating film; first conductivity-type source and drain regions formed within the semiconductor substrate at both sides of the floating gate electrode; a dielectric capacitor, which is connected to the floating gate electrode and has a dielectric layer; a ferroelectric capacitor, which is connected to the floating gate electrode and has a ferroelectric layer; and first and second polarization voltage application terminals, which are connected to the dielectric capacitor and the ferroelectric capacitor, respectively, and which apply voltage for generating polarization to the ferroelectric capacitor.

With this configuration, a structure is obtained in which the dielectric capacitor and the ferroelectric capacitor are connected in series between the first and second polarization voltage application terminals. The two polarization voltage application terminals can be used instead of the semiconductor substrate to generate polarization of the ferroelectric layer without hardly any restrictions, and to carry out the writing of data. Moreover, even if voltage is not applied to the ferroelectric layer during read-out, it is possible to read out information utilizing the fact that the current flowing between the source and drain regions changes depending on the amount of the charge of the floating gate electrode, or whether that charge is positive or negative.

It is preferable that the dielectric layer of the dielectric capacitor is provided on the floating gate electrode; that a polarization gate electrode is further provided on the dielectric layer; that the first polarization voltage application terminal is connected to the polarization gate electrode; and that the dielectric capacitor is configured having the floating gate electrode as a lower electrode, and the polarization gate electrode as an upper electrode.

It is preferable that the ferroelectric capacitor has a lower electrode that is provided above the floating gate electrode, and an upper electrode that is in opposition to the lower electrode, the ferroelectric layer being sandwiched between the lower electrode and the upper electrode; and that the second polarization voltage application terminal is connected to the upper electrode of the ferroelectric capacitor. Thus, the size of the ferroelectric capacitor can be relatively freely designed, and the information storing function of the semiconductor device is improved.

It is preferable that the semiconductor device further includes a pass transistor that is connected to either the source region or the drain region and that carries out ON/OFF control with a control signal. Thus, it is possible to achieve an improvement in the operation speed.

It is preferable that the semiconductor device further includes an insulating film for capacitive coupling provided on the floating gate electrode, and a control gate electrode provided on the insulating film for capacitive coupling. Thus, it is possible to simultaneously perform the writing operation and the read-out operation.

It is preferable that the semiconductor device further includes second conductivity-type source and drain regions, which are provided within the semiconductor substrate at both sides of the floating gate electrode, and which are separated from the first conductivity-type source and drain regions; and that two MISFETs of opposite conductivity type are configured with the regions between the two source and drain regions serving as channel regions. Thus, the semiconductor device can be configured to function as a nonvolatile inverter.

In that case, it is preferable that the semiconductor device further includes two insulating films for capacitive coupling, both provided above the floating gate electrode, and control gate electrodes, each provided on an insulating film for capacitive coupling.

It is preferable that the semiconductor device further includes a first-stage inverter for inputting complementary signals into the ferroelectric capacitor and the dielectric capacitor, and that the semiconductor device functions as a nonvolatile flip-flop.

It is preferable that the semiconductor device further includes an intermediate inverter, which is disposed between the first-stage inverter and either the ferroelectric capacitor or the dielectric capacitor. Thus, operational reliability is improved.

A method for driving a semiconductor device according to the present invention, the semiconductor device including a semiconductor substrate; a gate insulating film formed on the semiconductor substrate; a floating gate electrode formed on the gate insulating film; first conductivity-type source and drain regions formed within the semiconductor substrate at both sides of the floating gate electrode; a dielectric capacitor, which is connected to the floating gate electrode and has a dielectric layer; a ferroelectric capacitor, which is connected to the floating gate electrode and has a ferroelectric layer; and first and second polarization voltage application terminals, which are connected to the dielectric capacitor and the ferroelectric capacitor, respectively, and which apply voltage for generating polarization to the ferroelectric capacitor, wherein during writing, in accordance with the information "0" or "1" that is to be written, the voltage applied to the first and second polarization voltage application terminals is reversed between high and low.

With this method, it is possible to write and read out information without using a negative voltage, so it is possible to lower the power source voltage and to simplify the structure of the semiconductor device.

In that case, it is preferable to apply a read-out voltage to the first polarization voltage application terminal during the read-out. Thus, it becomes easy to set the read-out voltage such that a threshold shift can be reliably obtained.

DETAILED DESCRIPTION OF THE INVENTION

First Embodiment

Basic structure of a nonvolatile semiconductor storage element

Figure 1:
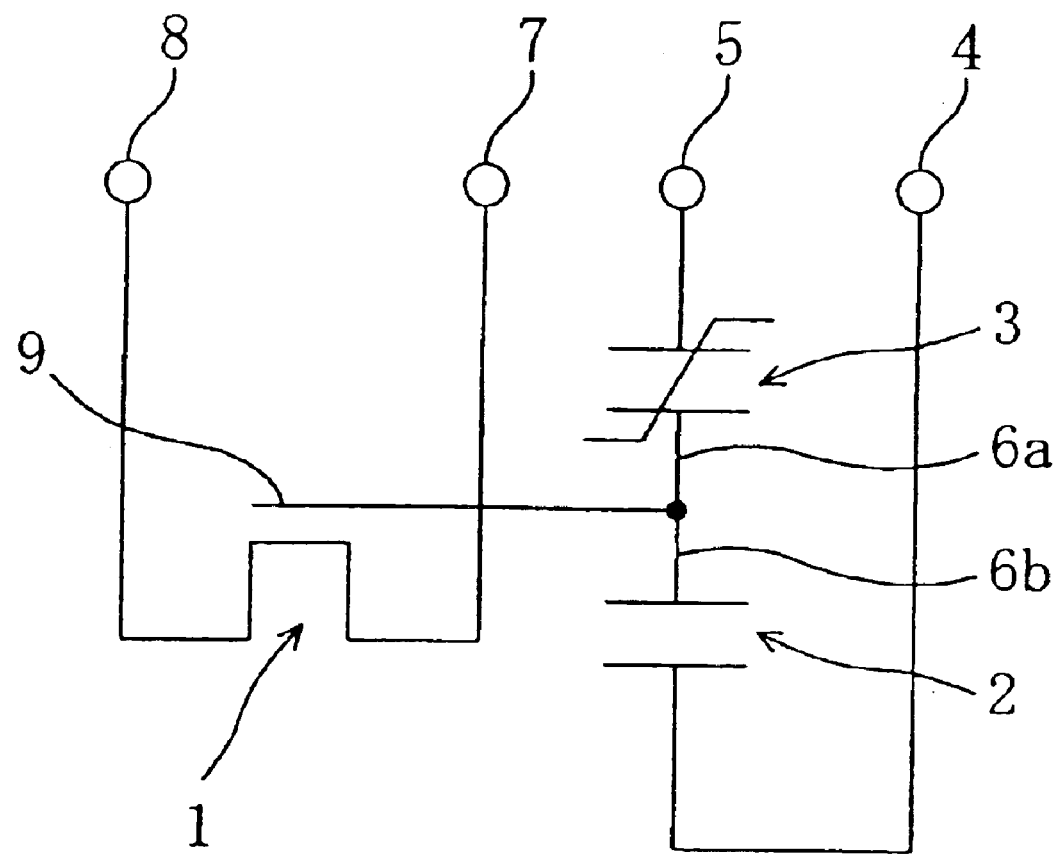
FIG. 1 is an equivalent circuit diagram of a nonvolatile semiconductor storage element (nonvolatile memory cell) according to a first embodiment of the present invention.

FIG. 1 is an equivalent circuit diagram of a nonvolatile semiconductor storage element (nonvolatile memory cell) according to a first embodiment of the present invention.

As shown in FIG. 1, the nonvolatile semiconductor storage element of the present embodiment is provided with a MISFET 1, a floating gate electrode 9 of the MISFET 1, and a dielectric capacitor 2 and a ferroelectric capacitor 3, which are connected to the floating gate electrode 9 via a node 6a and a node 6b, respectively. Also, this nonvolatile semiconductor storage element is configured such that polarization can be generated as information in the ferroelectric film of the ferroelectric capacitor 3 by applying a voltage between a first polarization voltage supplying terminal 4 and a second polarization voltage supplying terminal 5. Furthermore, it is configured such that when read-out voltage is applied between a ground terminal 7 and a power source voltage terminal 8, which are connected to the source and drain regions of the MISFET 1, the MISFET 1 is turned on or off in accordance with the charge held in the floating gate electrode 9, and thus the information in the floating gate electrode 9 is read out. That is, the basic structure of the nonvolatile semiconductor storage element of the present embodiment is that of an MFMISFET.

Figure 2A:
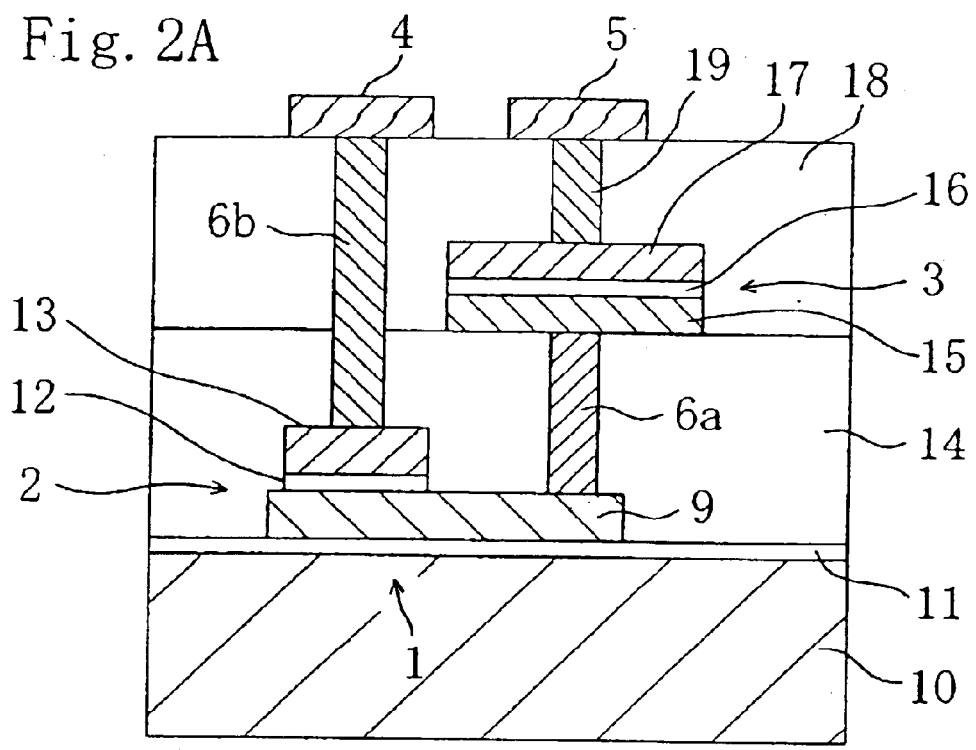
FIG. 2A is a cross-sectional view taken along a cross-section perpendicular to the channel direction of a nonvolatile semiconductor storage element according to the first embodiment.
Figure 2B:
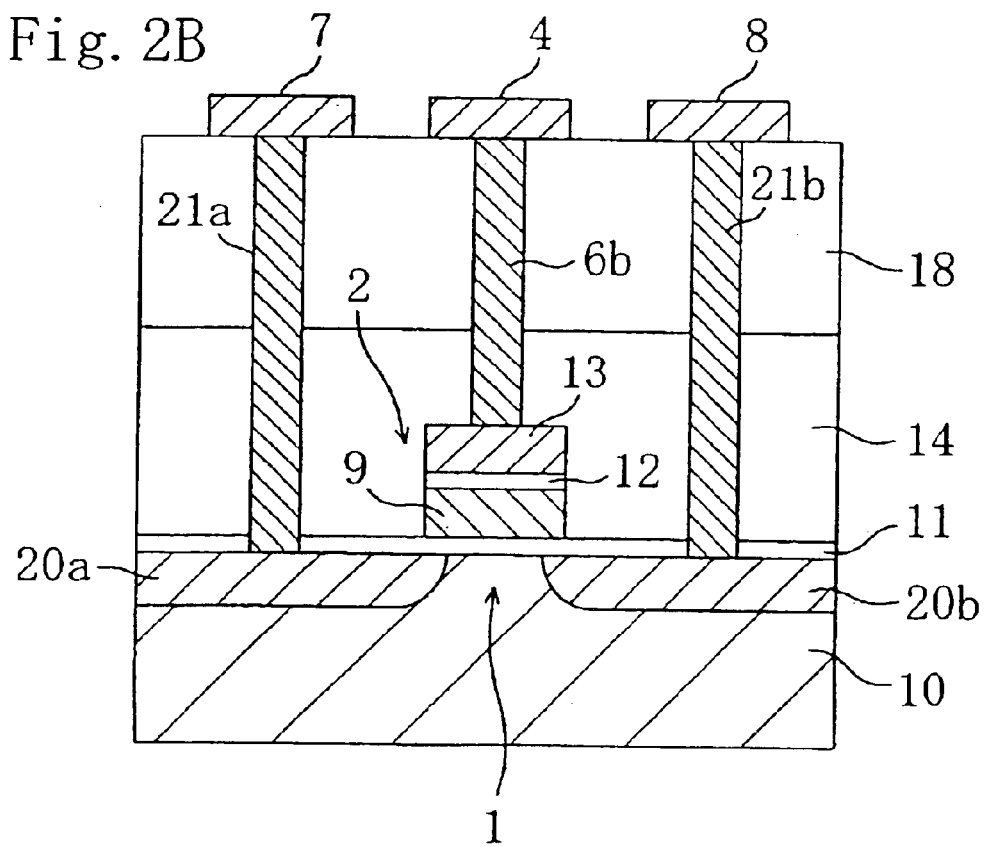
FIG. 2B is a cross-sectional view taken along a cross-section parallel to the channel direction of the same.

FIG. 2A is a cross-sectional view taken along a cross-section perpendicular to the channel direction of the nonvolatile semiconductor storage element of the present embodiment, and FIG. 2B is a cross-sectional view taken along a cross-section parallel to the channel direction of the same.

As shown in FIGS. 2A and 2B, the nonvolatile semiconductor storage element (nonvolatile memory cell) includes the MISFET 1, which is provided on the active region of a p-type silicon substrate 10. The MISFET 1 includes a gate insulating film 11, the floating gate electrode 9 provided on the gate insulating film 11, and n-type source and drain regions 20a and 20b formed at both sides of the floating gate electrode 9 in the silicon substrate 10.

The memory cell is provided with a polarization gate electrode 13 disposed above the floating gate electrode 9, and a dielectric layer 12 intervening between the floating gate electrode 9 and the polarization gate electrode 13. The dielectric capacitor 2 is made up of the floating gate electrode 9, the dielectric layer 12, and the polarization gate electrode 13. Furthermore, the memory cell includes a first interlayer insulating film 14 made of silicon oxide provided on top of the silicon substrate 10, a lower electrode 15 provided on the first interlayer insulating film 14, an upper electrode 17 provided above the lower electrode 15, and a ferroelectric layer 16 intervening between the lower electrode 15 and the upper electrode 17. The lower electrode 15, the ferroelectric layer 16, and the upper electrode 17 make up the ferroelectric capacitor 3. Moreover, the lower electrode 15 of the ferroelectric capacitor 3 is connected to the floating gate electrode 9 by the node 6a, which is made of a plug that passes through the first interlayer insulating film 14.

A second interlayer insulating film 18 made of silicon oxide is provided on the first interlayer insulating film 14, and the ground terminal 7 and the power source voltage terminal 8 are provided on top of the second interlayer insulating film 18. Furthermore, the ground terminal 7 and the power source voltage terminal 8 are connected to the source and drain regions 20a and 20b via contacts 21a and 21b, respectively, the contacts passing thorough the first and second interlayer insulating films 14 and 18.

The first and second polarization voltage supplying terminals 4 and 5 are provided on the second interlayer insulating film 18. The first polarization voltage supplying terminal 4 is connected to the polarization gate electrode 13 by the node 6b, which is a contact that passes through the first and second interlayer insulating films 14 and 18. The second polarization voltage supplying terminal is connected to the upper electrode 17 of the ferroelectric capacitor by a plug 19 that passes through the second interlayer insulating film 18.

That is, the dielectric capacitor 2 and the ferroelectric capacitor 3 are arranged in parallel with respect to the floating gate electrode 9. Furthermore, the dielectric capacitor 2 and the ferroelectric capacitor 3 are connected in series between the first polarization voltage supplying terminal 4 and the second polarization voltage supplying terminal 5.

Operations of the nonvolatile semiconductor storage element (nonvolatile memory cell) of the present embodiment are explained below with reference to FIG. 1 and FIGS. 2A and 2B.

Writing Operation

The drain current of the MISFET 1 depends on the potential of the floating gate electrode 9, and the amount of charge that is stored in the floating gate electrode 9 of the MISFET 1 determines the gate potential. Consequently, to control the drain current of the MISFET 1, the amount of charge on the floating gate electrode 9 must be adjusted.

When the potential of the floating gate electrode 9 is below the threshold voltage Vt of the MISFET 1, the MISFET 1 is in an off state, and drain current does not flow. On the other hand, when the potential of the floating gate electrode 9 is a voltage above the threshold voltage Vt, drain current flows. Thus, by sensing the drain current, the on and off state of the MISFET 1 is identified, that is, the stored information "1" or "0" is determined. Therefore, the potential of the gate electrode 9 must be set to a potential that is below or above the threshold value.

When the substrate potential of the MISFET 1 is set to the ground level, then, if the information "1" is to be written, a positive voltage is applied between the first polarization voltage application terminal 4 and the second polarization voltage application terminal 5, such that the potential of the first polarization voltage application terminal 4 becomes higher than that of the second polarization voltage application terminal 5, to cause a positive polarization in the ferroelectric layer 16. On the other hand, if the information "0" is to be written, a negative voltage is applied between the first polarization voltage application terminal 4 and the second polarization voltage application terminal 5, such that the potential of the second polarization voltage application terminal 5 becomes higher than that of the first polarization voltage application terminal 4.

Figure 3:
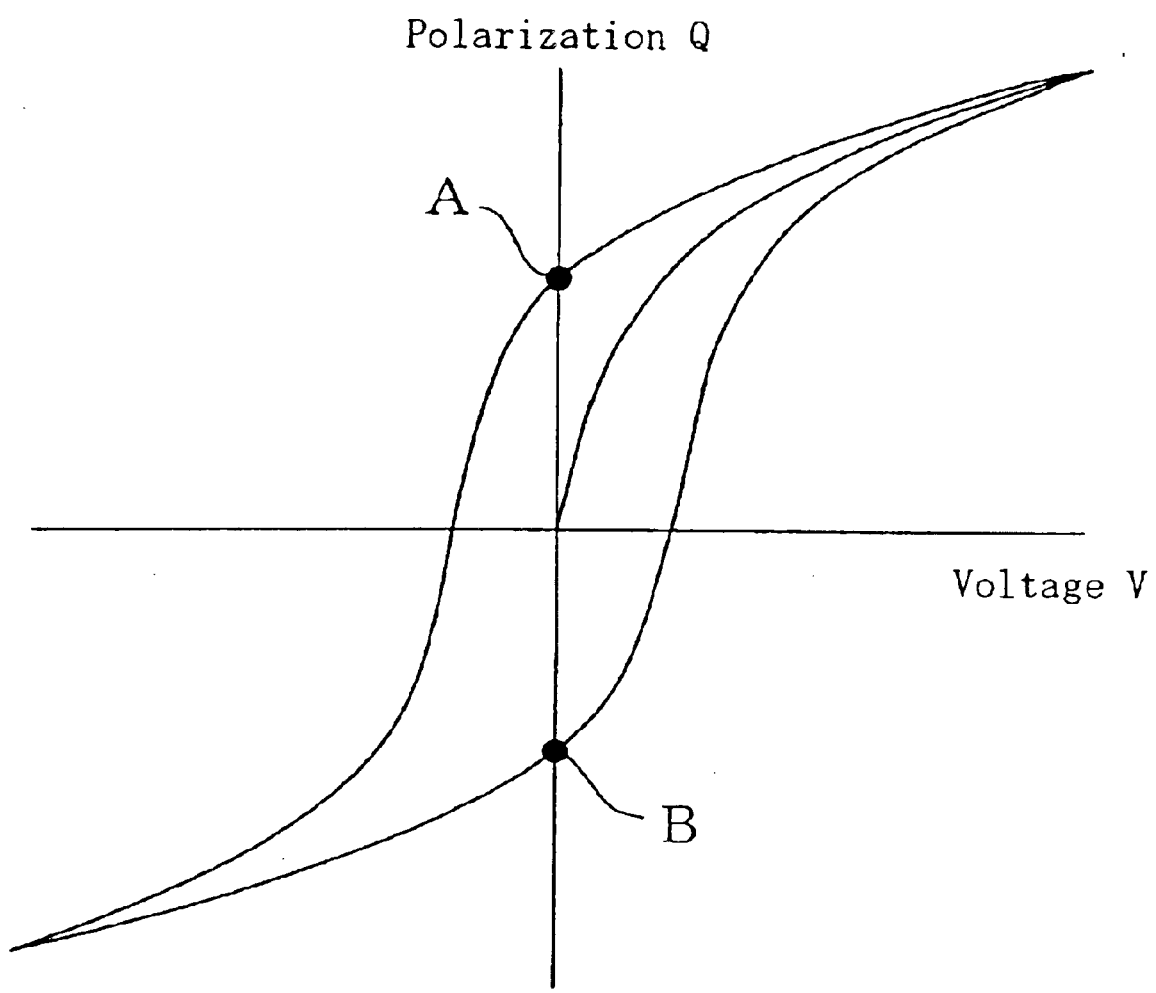
FIG. 3 is a graph showing the voltage-polarization hysteresis of voltage/polarization in an ordinary ferroelectric layer.

FIG. 3 is a graph showing the voltage-polarization hysteresis of the ferroelectric layer 16. Here, downward polarization of the ferroelectric layer 16 is taken as positive polarization, and upward polarization is taken as negative polarization. That is, when a positive voltage V is applied between the first polarization voltage application terminal 4 and the second polarization voltage application terminal 5, a positive polarization Q occurs in the ferroelectric layer 16. Next, when the positive voltage V is increased, the polarization Q in the ferroelectric layer 16 increases in the positive direction, and once a certain voltage V is exceeded, the polarization Q becomes saturated. Then, when the application of the voltage V is stopped, the polarization Q of the ferroelectric layer 16 does not fall to zero, and the state of polarization when holding is expressed by the intersection of the hysteresis curve shown in FIG. 3 and the load curve diagramed from the load capacity which encompasses mainly the dielectric capacitor 2. If the potential of the floating gate electrode 9 that is determined by the amount of positive charge at this time is above the threshold voltage Vt of the MISFET 1, then the MISFET 1 is turned on when voltage is applied between the source and drain regions 20a and 20b. This state of holding an electric charge shall be "1."

On the other hand, when a negative voltage V is applied between the first polarization voltage application terminal 4 and the second polarization voltage application terminal 5, a negative polarization Q occurs in the ferroelectric layer 16. Then, when the negative voltage V increases in the negative direction, the polarization Q in the ferroelectric layer 16 increases in the negative direction, and once the voltage V is increased beyond a certain voltage, the polarization Q becomes saturated. When the application of voltage V is then stopped, the polarization Q of the ferroelectric layer 16 does not fall to zero, and the state of polarization when holding is expressed by the intersection of the hysteresis curve expressed in FIG. 3 and the load curve diagramed from the load capacity which encompasses mainly the dielectric capacitor 2. If the potential of the floating gate electrode 9 that is determined by the amount of negative charge at this time is above the threshold voltage Vt of the MISFET 1, then the MISFET 1 stays off even if voltage is applied between the source and drain regions 20a and 20b. This state of holding an electric charge shall be "0."

The information "1" and "0," however, is simply a matter only of definition, so it is also possible to define the state in which there is upward facing remanent polarization in the ferroelectric layer 16 as "1," and the state in which there is downward facing remanent polarization as "0."

Here, the capacity between the floating gate electrode 9 of the MISFET 1, the gate insulating film 11, and the silicon substrate 10 shall be Ci, the capacity of the dielectric capacitor 2 shall be Cr, and the capacity of the ferroelectric capacitor 3 shall be Cf. If the writing voltage applied between the first and second polarization voltage application terminals 4 and 5 is Vw, then the writing voltage Vw is distributed between the dielectric layer 12, the ferroelectric layer 16, and the gate insulating film 11. However, the silicon substrate 10 is taken to be grounded.

At this time, when the voltage applied to the first polarization voltage application terminal 4 is positive, and the voltage that is applied to the second polarization voltage application terminal 5 is at zero (ground) potential (when the information "1" is written), then the writing voltage Vw applied between the first and second polarization voltage application terminals 4 and 5 is distributed to the floating gate electrode 9 with a distribution ratio according to the serial arrangement of the capacities (Cf+Ci) and the capacity Cr. Then, when the application of the writing voltage Vw is stopped and the voltage between the first and second polarization voltage application terminals 4 and 5 is returned to zero, downward remanent polarization is retained in the ferroelectric layer 16, and a positive charge is induced such that a voltage of at least the threshold voltage Vt is applied to the floating gate electrode 9.

On the other hand, when the voltage applied to the second polarization voltage application terminal 5 is positive, and the voltage that is applied to the first polarization voltage application terminal 4 is zero (ground) potential, (when the information "0" is written), then the writing voltage Vw applied between the first and second polarization voltage application terminals 4 and 5 is distributed to the floating gate electrode 9 with the distribution ratio according to the serial arrangement of the capacity (Cr+Ci) and the capacity Cf. Then, when the application of the writing voltage Vw is stopped and the voltage between the first and second polarization voltage application terminals 4 and 5 is returned to zero, upward remanent polarization is retained in the ferroelectric layer 16, and a negative charge is induced such that a voltage below the threshold voltage Vt is imparted to the floating gate electrode 9.

When rewriting, a voltage should be applied between the first and second polarization voltage application terminals 4 and 5 such that a voltage of at least the coercive voltage is imparted to the ferroelectric capacitor 3.

It should be noted that, if possible, it is preferable that the writing voltage Vw applied between the first and second polarization voltage application terminals 4 and 5 is set such that at least a voltage saturating the polarization in the ferroelectric layer 16 is applied to create a remanent polarization Q at point A or point B in FIG. 3.

Furthermore, the voltage of the silicon substrate 10 during writing can be floating. In that case, if the voltage of the silicon substrate 10 is an intermediate voltage of the voltage between the first and second polarization voltage application terminals 4 and 5, then a writing voltage Vw at which the voltage applied to the ferroelectric layer 16 is greater than the saturation voltage should be determined for example by simulation, and the writing voltage Vw should be set to that value.

Read-Out Operation

Read-out is performed by applying a read-out voltage Vr between the ground terminal 7 and the power source voltage terminal 8 of the MISFET 1, and detecting the drain current at that time. That is, if a positive charge equivalent to a "1" is held by the floating gate electrode 9, the voltage of the floating gate electrode 9 will be at least the threshold voltage Vt, so the MISFET 1 is on, and a large drain current flows. On the other hand, if a negative charge, which is equivalent to a "0," is held by the floating gate electrode 9, the voltage of the floating gate electrode 9 will be below the threshold voltage Vt, so the MISFET 1 is off, and hardly any drain current flows. Consequently, if the drain current is magnified by a sense amplifier, for example, the stored information "1" or "0" can be easily distinguished by the size of the drain current. During read-out it is unnecessary to apply voltage to the polarization gate electrode 13, and if no voltage is applied, the potential of the polarization gate electrode 13 can be set to floating.

With the nonvolatile semiconductor storage element (nonvolatile memory cell) of the present embodiment, it is possible determine the stored information "1" or "0" in a read-out operation by detecting the drain current when voltage is not applied across the ferroelectric layer 16 but voltage is applied between the source and drain regions, and thus a reduction in read disturb of the ferroelectric capacitor 3 can be achieved.

The same read-out method as with the present embodiment would seem to be possible using an MFISFET having a gate insulating film in which a dielectric layer and a ferroelectric layer are layered on one another, however, in the case of an MFISFET, during writing, a voltage for generating polarization in the ferroelectric layer is applied between the gate electrode and the semiconductor substrate, so there is a restriction to the voltage that can be applied. That is, the potential of the semiconductor substrate is usually set to the ground voltage, so in practical terms, changing this at each memory cell would not be feasible.

Modified Example of the Read-Out Operation

In the read-out operation, it is also possible to apply a certain voltage from the first polarization voltage application terminal 4 to the polarization gate electrode 13. In that case, a voltage is applied to the floating gate electrode 9 in accordance with the capacitive coupling function of the dielectric layer 12. Therefore, as described later, it becomes possible to make suitable adjustments such that the threshold shift of the MISFET 1 occurs reliably in the floating gate electrode 9, improving the accuracy with which information is detected.

In particular, by applying the same voltage to the second polarization voltage application terminal 5 as to the first polarization voltage application terminal 4, the voltage that is applied to the ferroelectric capacitor 3 is lowered, so that the polarization of the ferroelectric layer 16 is not changed, and read disturb can be reduced.

The potential of the floating gate electrode 9 after writing is finished depends on the amount of charge in the floating gate electrode 9 generated by the remanent polarization of the ferroelectric layer 16, and because that remanent polarization depends on the distribution ratio of the writing voltage Vw, the potential generated in the floating gate electrode 9 always becomes lower than the power source voltage when the writing voltage Vw is set to the power source voltage. For that reason, when, as in the first embodiment, a method is used in which voltage from the outside is not applied to the floating gate electrode 9 during read-out, the drain current of the MISFET 1 of the present embodiment becomes smaller than that of a normal MISFET in which power source voltage is applied to the gate electrode to drive the MISFET.

Therefore, by applying voltage to the second polarization voltage application terminal 5 during read-out, read-out voltage is added to the floating gate electrode 9 from the polarization gate electrode 13 via the dielectric layer 12. That is, during read-out the potential of the floating gate electrode 9 is the value obtained by adding the potential obtained by the charge induced by the remanent polarization of the ferroelectric layer 16, and the voltage that is applied to the floating gate electrode 9 from the polarization gate electrode 13 by capacitive coupling.

Consequently, for example, even if the potential of the floating gate electrode 9 is below the threshold voltage Vt of the MISFET 1, regardless of whether the information is "1" or "0," the potential of the floating gate electrode 9 is increased, and can be controlled to at least the threshold voltage Vt (for "1") or below the threshold voltage Vt (for "0"). Thus, the potential of the floating gate electrode 9 that is imparted by the polarization of the ferroelectric layer 16 can be set to a low value. Furthermore, the reverse electric field that is applied to the ferroelectric layer 16 during read-out can be reduced, and it is possible to achieve a reduction in leak current during standby and an increase in drain current during read-out. Moreover, it is possible to reduce power consumption, because current flows only during read-out.

There is also the advantage that for example when a plurality of MISFETs 1 are connected in series to form a NAND-type memory cell, memory cells other than the selected memory cell must be turned off during read-out, and with this embodiment the transistors can be turned on or off by the application of voltage from the polarization gate electrode 13.

Also, in the present embodiment, the ferroelectric capacitor 3 was provided on the first interlayer insulating film 14, but by forming the ferroelectric layer 16 so that it contacts the floating gate electrode 9, the lower electrode of the ferroelectric capacitor and the floating gate electrode 9 can be devised as a common electrode.

In the present embodiment, when writing the information "1" and the information "0", high voltage and low voltage applied to the first and second polarization voltage application terminals 4 and 5 were reversed, but the method of applying polarization in the present invention is not limited to the method of the present embodiment. For example, it is also possible that the voltage applied to the first and second polarization voltage application terminals 4 and 5 when writing the information "1" is the same as in the present embodiment, and when writing the information "0," it is possible to apply a negative voltage to the first polarization voltage application terminal 4 and to apply a ground voltage of "0" to the second polarization voltage application terminal 5.

However, with the method for applying voltage according to the first embodiment, it is unnecessary to expressly provide the nonvolatile semiconductor storage element with a negative potential, so it is easy to incorporate the nonvolatile semiconductor storage element of the present embodiment into a normal logic circuit, and as a result, one benefit is that the voltage can be lowered.

Second Embodiment

Figure 4:
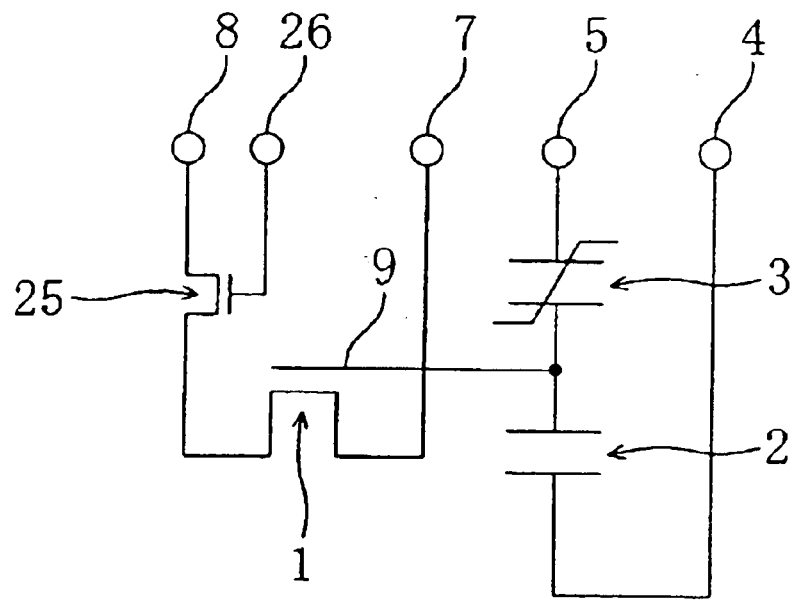
FIG. 4 is an equivalent circuit diagram of a nonvolatile semiconductor storage element according to a second embodiment of the present invention.

FIG. 4 is an equivalent electric circuit diagram of a nonvolatile semiconductor storage element (nonvolatile memory cell) according to a second embodiment of the present invention.

As shown in FIG. 4, in addition to the configuration of the semiconductor storage element according to the first embodiment, the nonvolatile semiconductor storage element of the present embodiment includes a pass transistor 25, which is provided between the MISFET 1 and the power source voltage terminal 8, and a control terminal 26, which is connected to the gate electrode of the pass transistor 25. In the present embodiment, structural components such as the MISFET 1, the dielectric capacitor 2, the ferroelectric capacitor 3, the first polarization voltage application terminal 4, the second polarization voltage application terminal 5, the ground terminal 7, and the power source voltage terminal 8, are the same as those of the first embodiment, so further diagrammatic illustration and description of the structure of the nonvolatile semiconductor storage element (nonvolatile memory cell) has been omitted.

The pass transistor 25 is turned on and off by controlling the potential imparted from the control terminal 26 to a read-out gate electrode of the pass transistor 25. A voltage pulse is applied to the read-out gate electrode for turning on the pass transistor 25 only when reading out the drain current of the MISFET 1, thus obtaining a voltage for read-out (a read-out signal) between the source and drain regions.

With the nonvolatile semiconductor storage element of the present embodiment, in addition to the effects of the semiconductor storage element of the first embodiment, a read-out signal can be imparted by pulse, so high-speed read-out becomes possible.

Third Embodiment

Figure 5:
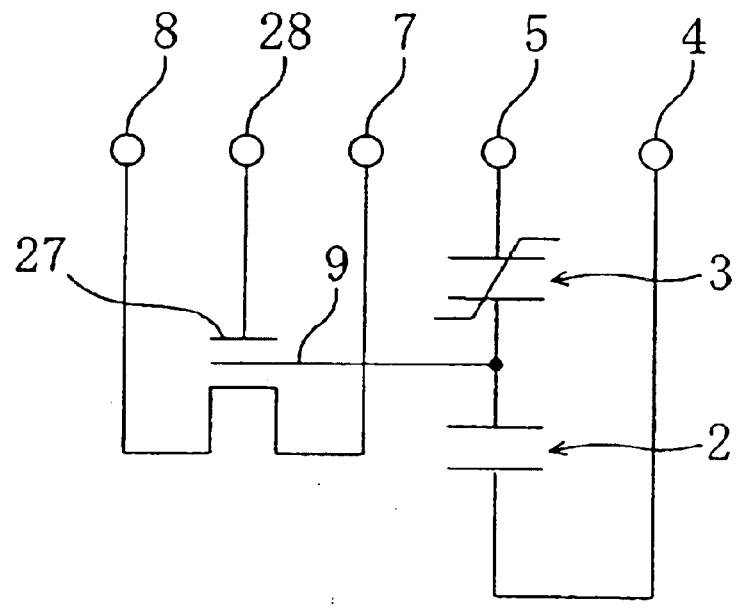
FIG. 5 is an equivalent circuit diagram of a nonvolatile semiconductor storage element according to a third embodiment of the present invention.

FIG. 5 is an equivalent circuit diagram of a nonvolatile semiconductor storage element according to a third embodiment of the present invention.

As shown in FIG. 5, the nonvolatile semiconductor storage element of the present embodiment includes, in addition to the structure of the semiconductor storage element according to the first embodiment, a control gate electrode 27, which is provided above the floating gate electrode 9 of the MISFET 1 and sandwiches the insulating film therewith, and a control voltage applying terminal 28 for applying a read-out voltage to the control gate electrode 27. That is to say, in addition to the MISFET 1, the dielectric capacitor 2, the ferroelectric capacitor 3, the first polarization voltage application terminal 4, the second polarization voltage application terminal 5, the ground terminal 7, and the power source voltage terminal 8 of the nonvolatile semiconductor storage element of the first embodiment as shown in FIGS. 2A and 2B, the nonvolatile semiconductor storage element (nonvolatile memory cell) of the present embodiment includes an insulating layer for capacitive coupling and a control gate electrode 27 layered on the floating gate electrode 9, a plug, which passes through the first and second interlayer insulating films 14 and 18 and is connected to the control gate electrode, and the control voltage applying terminal 28, which is connected to that plug and extends over the second interlayer insulating film.

In the first embodiment, the potential of the floating gate electrode 9 after writing is finished depends on the amount of charge in the floating gate electrode 9 that is generated by the remanent polarization of the ferroelectric layer 16, and that remanent polarization depends on the distribution ratio of the writing voltage Vw, so when the writing voltage Vw is set to the power source voltage, the potential that is generated in the floating gate electrode 9 always becomes lower than the power source voltage. For that reason, when a method is used in which voltage from the outside is not applied to the floating gate electrode 9 during read-out as in the first embodiment, the drain current of the MISFET 1 becomes smaller than that of a normal MISFET, in which power source voltage is applied to the gate electrode to drive the MISFET.

With the present embodiment, however, during read-out, read-out voltage is added to the floating gate electrode 9 from the polarization gate electrode 13 via the dielectric layer 12 by applying voltage to the control gate electrode 27. That is, at the time of read-out the potential of the floating gate electrode 9 is the value obtained by adding the potential according to the charge induced by the remanent polarization of the ferroelectric layer 16, and the voltage that is applied to the floating gate electrode 9 from the control gate electrode 27 by capacitive coupling.

Consequently, for example, even if the potential of the floating gate electrode 9 is below the threshold voltage Vt of the MISFET 1, regardless of whether the information is "1" or "0," the potential of the floating gate electrode 9 is increased, and can be controlled to at least the threshold voltage Vt (for "1") or to below the threshold voltage Vt (for "0"). Thus, the potential of the floating gate electrode 9 that is imparted by the polarization of the ferroelectric layer 16 can be set to a low value. Additionally, the reverse electric field that is applied to the ferroelectric layer 16 during read-out can be reduced, and it is possible to achieve a reduction in leak current during standby and an increase in drain current during read-out. Moreover, it is possible to reduce power consumption, because current flows only during read-out.

For example, when a plurality of MISFETs 1 are connected in series to form an NAND-type memory cell, memory cells other than the selected memory cell must be turned off during read-out, and one advantage is that at that time the transistors can be turned on and off by the application of voltage from the control gate electrode 27.

In particular, by applying the same voltage to the second polarization voltage application terminal 5 as to the control voltage applying terminal 28, the voltage that is applied to the ferroelectric capacitor 3 is lowered, so the polarization of the ferroelectric layer 16 is not changed, and read disturb can be reduced.

The above effects are the same as those when applying a read-out voltage to the polarization gate electrode 13 in the above-mentioned first embodiment, but with the present embodiment, the following effects can further be obtained.

Because in the configuration of the present embodiment the terminals necessary for writing (the first and second polarization voltage application terminals 4 and 5), and the terminals necessary for read-out (the ground terminal 7, the power source voltage terminal 8, and the control voltage applying terminal 28) are provided separate from one another, the nonvolatile semiconductor storage element of the present embodiment can be used as a so-called dual port memory, that is, it can be used to perform read-out and writing simultaneously.

Fourth Embodiment

Figure 6:
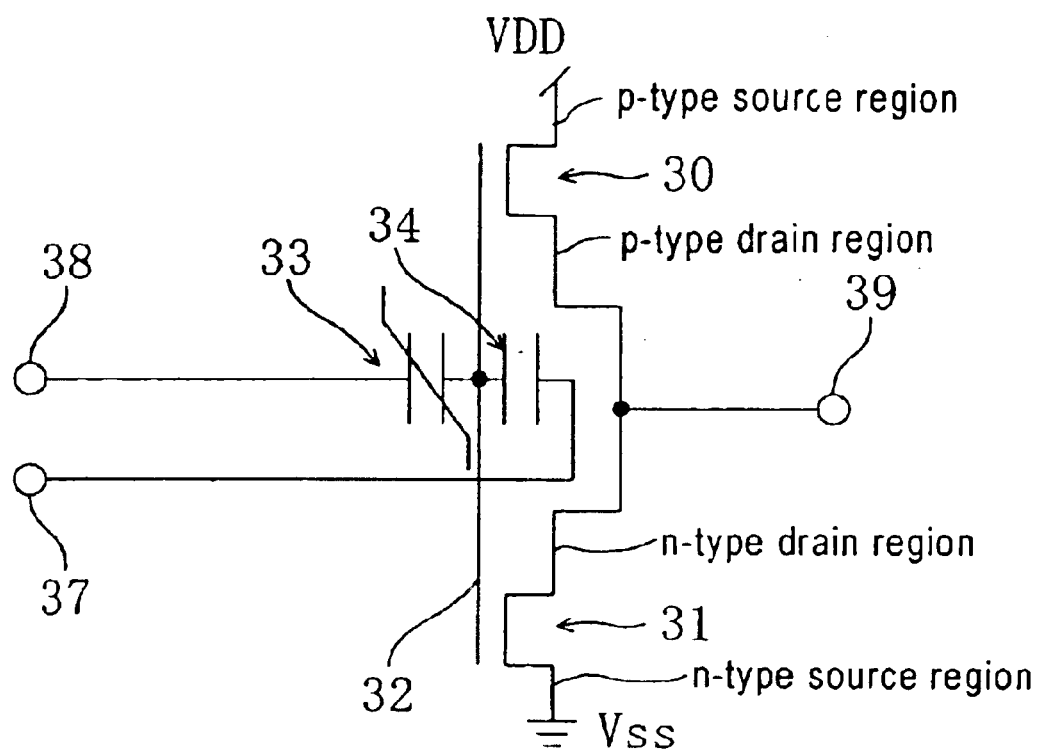
FIG. 6 is an equivalent circuit diagram of a nonvolatile logic element according to a fourth embodiment of the present invention.
Figure 7:
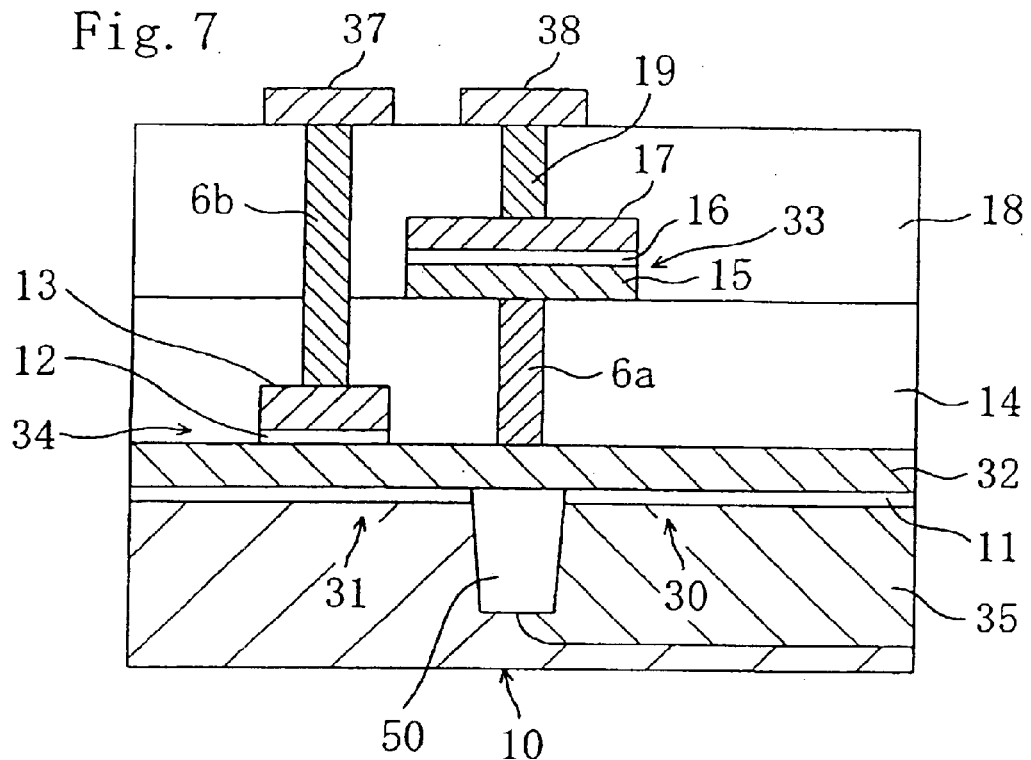
FIG. 7 is a cross-sectional view taken along a cross-section perpendicular to the channel direction of a nonvolatile logic element according to a fourth embodiment of the present invention.

FIG. 6 is an equivalent circuit diagram of a nonvolatile logic element (nonvolatile inverter) according to a fourth embodiment of the present invention. FIG. 7 is a cross-sectional view taken along a cross-section perpendicular to the channel direction of a nonvolatile logic element according to a fourth embodiment of the present invention.

As shown in FIG. 6 and FIG. 7, the nonvolatile logic element of the present embodiment has the structure of an inverter, in which a p-channel MISFET 30 and an n-channel MISFET 31 are connected in series between a terminal for supplying power source voltage VDD and a terminal for supplying ground voltage Vss. However, the n-channel MISFET 31 is disposed within the substrate region of a p-type silicon substrate 10, and the p-channel MISFET 30 is disposed in an n-well 35, which is provided in the p-type silicon substrate 10. Additionally, a trench separation insulating film 32 surrounding the active region is formed in the silicon substrate 10, and the region of the silicon substrate 10 in which the p-channel MISFET 30 is disposed is separated and insulated by the trench separation insulating film 32 from the region in which the n-channel MISFET 31 is disposed.

A floating gate electrode 32, which functions as the gate electrode for the MISFETs 30 and 31, is provided above the silicon substrate 10 and sandwiches the gate insulating film 11 therewith, and a ferroelectric capacitor 33, which has a ferroelectric layer 16, and a dielectric capacitor 34, which has a dielectric layer 12, are connected in parallel to the floating gate electrode 32. Furthermore, a first polarization voltage application terminal 37, which is connected to the polarization gate electrode 13 of the dielectric capacitor 34, a second polarization voltage application terminal 38, which is for applying voltage to the upper electrode 17 of the ferroelectric capacitor 33, and an output terminal 39, which is for outputting an output signal, are also provided. The remaining structure is the same as the structure of the nonvolatile semiconductor storage element according to the first embodiment and shown in FIG. 2A, so identical numerals have been given, and a further description has been omitted. Moreover, the structure (p-channel MISFET 30 and n-channel MISFET 31) in the cross-section parallel to the channel direction of the nonvolatile logic element of the present embodiment is basically the same as the structure shown in FIG. 2B, so a diagrammatic illustration or further explanation thereof has been omitted.

The nonvolatile logic element of the present embodiment has the structure of an inverter in which the p-channel MISFET 30 and the n-channel MISFET 31 are connected in series, and is equivalent to two MFMIS-type FETs formed in one piece. With the remanent polarization of the ferroelectric layer 16, it also has a nonvolatile storage function as described in the first embodiment. The following is an explanation of the writing operation and read-out operation of the nonvolatile logic element (nonvolatile inverter) according to the present embodiment.

Writing Operation and Read-Out Operation

The basic principle of the method for writing information into the nonvolatile logic element of the present embodiment is the same as that of the first embodiment. That is, by returning the voltage to zero after a positive or negative voltage has been applied between the first and second polarization voltage application terminals 37 and 38, remanent polarization (for example, the remanent polarization shown at point A or point B in FIG. 3) is generated in the ferroelectric layer 16 of the ferroelectric capacitor 33, and a potential is generated in the floating gate electrode 32 in accordance with the charge generated by the remanent polarization. If the information "1" is to be written, the potential of the floating gate electrode 32 is set such that the p-channel MISFET 30 is on and the n-channel MISFET 31 is off. Conversely, if the information "0" is to be written, the potential of the floating gate electrode 32, that is, the remanent polarization, is set such that the p-channel MISFET 30 is off and the n-channel MISFET 31 is on. At this time, the ratio of the distribution of voltage applied to the ferroelectric layer 16 and the dielectric layer 12 is as described in the first embodiment.

The signal that is input to the nonvolatile logic element of the present embodiment, for example, is taken as "H" when the signal input to the first polarization voltage application terminal 37 is of a high level and the signal input to the second polarization voltage application terminal 38 is of a low level, and is taken as "L" when the signal input to the first polarization voltage application terminal 37 is of a low level and the signal input to the second polarization voltage application terminal 38 is of a high level. In this situation, by defining the information "1" and "0" in the same way as in the first embodiment, a "1" is written in correspondence with the input of the logic signal "H", and a "0" is written to correspond to the input of the logic signal "L". Furthermore, when the information "1" is written, the logic signal "L" is output from the output terminal 39, and when the information "0" is written, the logic signal "H" is output from the output terminal 39. That is, the nonvolatile logic element outputs the logic signal "L" in correspondence with the input of the logic signal "H", and outputs the logic signal "H" in correspondence to the input of the logic signal "L". The output of these logic signals is equivalent to a read-out operation, and thus read-out is performed in accordance with the voltage that is applied to the ground terminal (not shown in the drawings) and the power source voltage terminal (not shown in the drawings).

That is to say, using the nonvolatile logic element (nonvolatile inverter) of the present embodiment, it is possible to obtain an output signal of an opposite (reverse) logic to the logic of the input signal. Moreover, the output signal stays latched in the floating gate electrode 32, so even if the power source is removed, the information remains, and thus a logic element that is nonvolatile (nonvolatile inverter) can be obtained. In circuits with ordinary inverters, the state of the inverters during operation is erased when the power source is cut off, so when the power source is cut off it is necessary to do the computations again from the start. Furthermore, if computations are stopped temporarily while in progress, those intermediate computation results must be saved in a memory device. In contrast, when the nonvolatile inverter of the present embodiment is used, the state of computations that are under way is retained as it is, so it is unnecessary to worry about the loss of intermediate calculation results caused by a temporary halt of the computations or the power source being cut off, and entirely new logic circuits can be constructed.

It should be noted that functions equivalent to the nonvolatile logic element of the present embodiment can be obtained by configuring an inverter by combining the n-channel MFSMIS-type FET described in the first embodiment with a p-channel MFSMIS-type FET that has essentially the same configuration, but the structure of the nonvolatile logic element of the present embodiment has the advantage in that it requires only one ferroelectric capacitor.

In the present embodiment, as in the first embodiment, it is also possible to apply the read-out voltage to the polarization gate electrode 13 from the first polarization voltage application terminal 37 during the read-out operation. In that case, a voltage according to the capacitive coupling function of the dielectric layer 12 is applied to the floating gate electrode 32, so that it is possible to obtain the same effects as those described in the modified example of the first embodiment.

In particular, by applying the same voltage to the second polarization voltage application terminal 38 as to the first polarization voltage application terminal 37, the voltage that is applied to the ferroelectric capacitor 33 is reduced, so the polarization of the ferroelectric layer 16 is not changed, and read disturb can be reduced.

Fifth Embodiment

Figure 8:
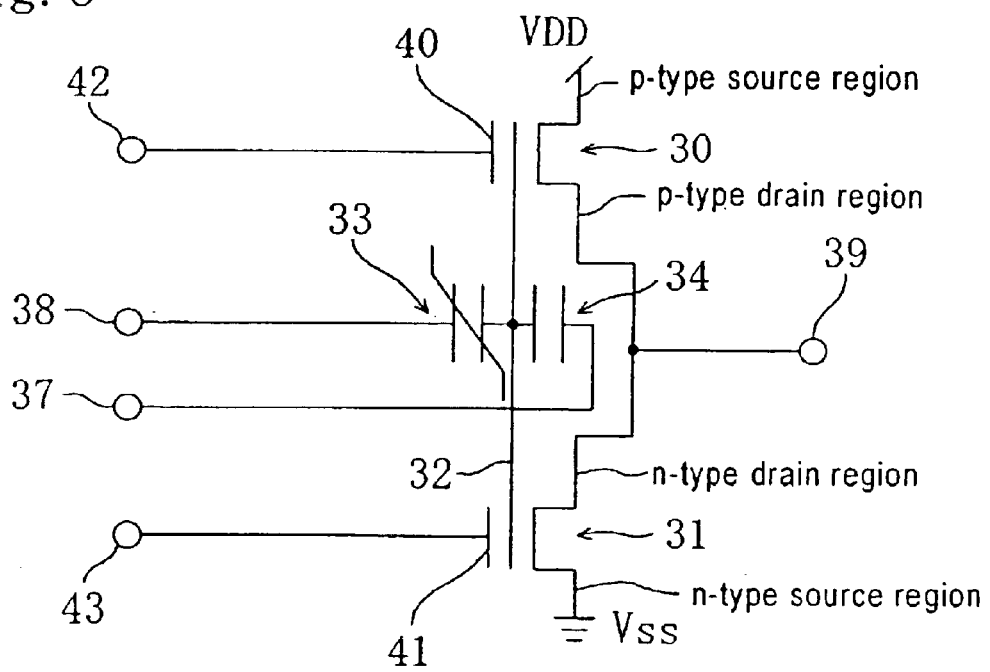
FIG. 8 is an equivalent circuit diagram of a nonvolatile logic element according to a fifth embodiment of the present invention.

FIG. 8 is an equivalent circuit diagram of a nonvolatile logic element (nonvolatile inverter) according to a fifth embodiment of the present invention.

As shown in FIG. 8, in addition to the configuration of the nonvolatile logic element according to the fourth embodiment, the nonvolatile logic element of the present embodiment includes, in the p-channel MISFET 30 and the n-channel MISFET 31, control gate electrodes 40 and 41, which are provided over the floating gate electrode 32, sandwiching an insulating film therewith, and control voltage applying terminals 42 and 43 for applying the read-out voltage to the control gate electrodes 40 and 41. That is, the nonvolatile logic element (nonvolatile inverter) of the present embodiment includes, in addition to the p-channel MISFET 30, the n-channel MISFET 31, the dielectric capacitor 34, the ferroelectric capacitor 33, the first polarization voltage application terminal 37, and the second polarization voltage application terminal 38 of the nonvolatile logic element of the fourth embodiment shown in FIG. 7, an insulating layer for capacitive coupling layered on the floating gate electrode 32 as well as control gate electrodes 40 and 41, and furthermore plug that pass through the first and second interlayer insulating films 14 and 18 and are connected to the control gate electrodes, and control voltage applying terminals 42 and 43, which are connected to the plugs and extend over the second interlayer insulating film.

According to the present embodiment, as in the third embodiment, by applying a certain voltage in the read-out operation to the control gate electrodes 40 and 41 from the control voltage applying terminals 42 and 43, a voltage is applied to the floating gate electrode 32 due to the capacitive coupling function of the insulating film for capacitive coupling, so the same effects as those explained in the third embodiment can be achieved.

In particular, when consideration is given to the fact that the bias suitable for generating a threshold shift is often different between the p-channel MISFET 30 and the n-channel MISFET 31, with the present embodiment, it is possible to individually apply control voltages to the control voltage applying terminals 42 and 43, so that it becomes easy to optimize the operation of the nonvolatile inverter.

Sixth Embodiment

Figure 9:
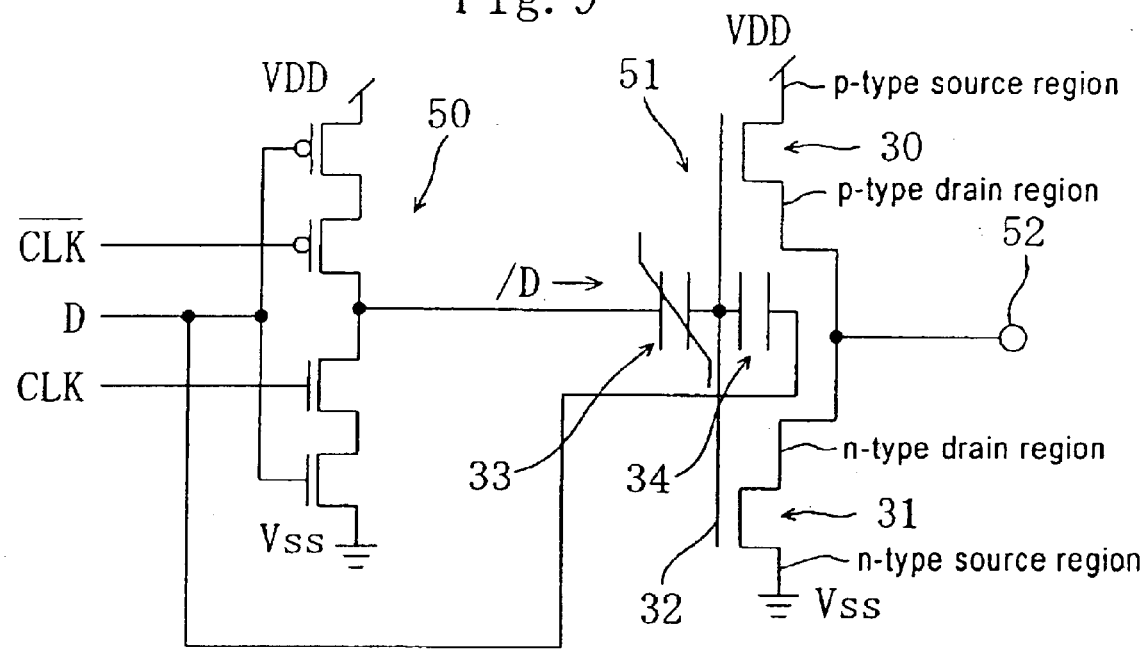
FIG. 9 is an equivalent circuit diagram of a nonvolatile logic element according to a sixth embodiment of the present invention.

FIG. 9 is an equivalent circuit diagram of a nonvolatile logic element (nonvolatile flip-flop) according to a sixth embodiment of the present invention.

As shown in FIG. 9, the nonvolatile logic element (nonvolatile flip-flop) of the present embodiment is provided with a first-stage inverter 50 between the terminal for supplying the power source voltage VDD and the terminal for supplying the ground voltage Vss, the first-stage inverter 50 being made by connecting two each of a normal (not having a nonvolatile storage function) p-channel MISFET and an n-channel MISFET in series. Moreover, a second-stage nonvolatile inverter 51 having the structure of the inverter of the aforementioned fourth embodiment is disposed on the second-stage side. That is, the second-stage inverter 51 is configured by the p-channel MISFET 30 and the n-channel MISFET 31 being arranged in series between the terminal for supplying power source voltage VDD and the terminal for supplying ground voltage Vss. Also, the second-stage nonvolatile inverter 51, as in the fourth embodiment, is provided with a floating gate electrode 32 that is common to both MISFETs 30 and 31, and a ferroelectric capacitor 33 and a dielectric capacitor 34 connected to the floating gate electrode 32 in parallel.

When a data signal D is inputted into the nonvolatile flip-flop of the present embodiment, the data signal D is reversed by the first-stage inverter 50, and a reversed signal/D of the data signal D is output from the first-stage inverter 50. Then, this reversed signal/D is applied to the ferroelectric capacitor 33 of the second-stage nonvolatile inverter 51, whereas the data signal D (non-reversed signal) is applied to the dielectric capacitor 34. That is, complementary signals are inputted into the ferroelectric capacitor 33 and the dielectric capacitor 34.

Next, as explained in the fourth embodiment, remanent polarization occurs in the ferroelectric layer in accordance with the voltage that is applied to the dielectric capacitor 34 and the ferroelectric capacitor 33, and a voltage that corresponds to the charge generated by this remanent polarization is applied to the floating gate electrode 32. The result is that when the data signal D is "H", the subsequent nonvolatile inverter 51 outputs a signal of "L" from the output terminal 52, and when the data signal D is "L," the subsequent nonvolatile inverter 51 outputs a signal of "H" from the output terminal 52.

That is to say, the nonvolatile logic element of the present embodiment functions as a nonvolatile flip-flop circuit.

Figure 14:
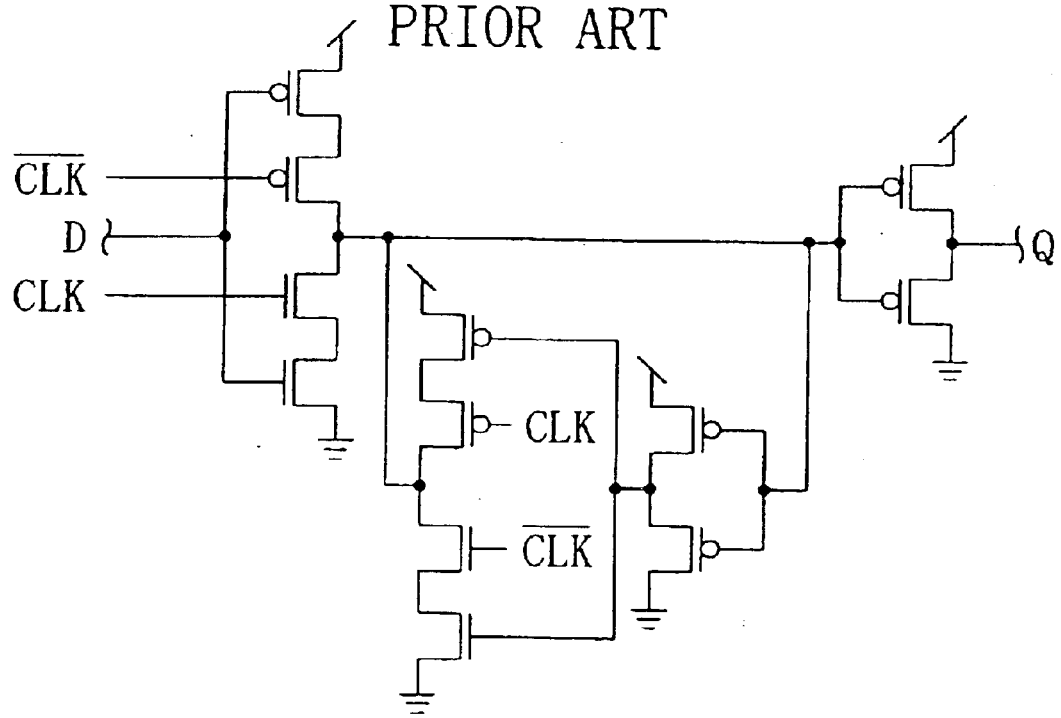
FIG. 14 is an equivalent circuit diagram of an ordinary flip-flop.

In comparison to the ordinary flip-flop shown in FIG. 14, effects attained by the nonvolatile logic element of the present invention functioning as a nonvolatile flip-flop circuit include achieving nonvolatile data latching and a reduction in the number of transistors, among other attainable effects.

Modified Example

Figure 10:
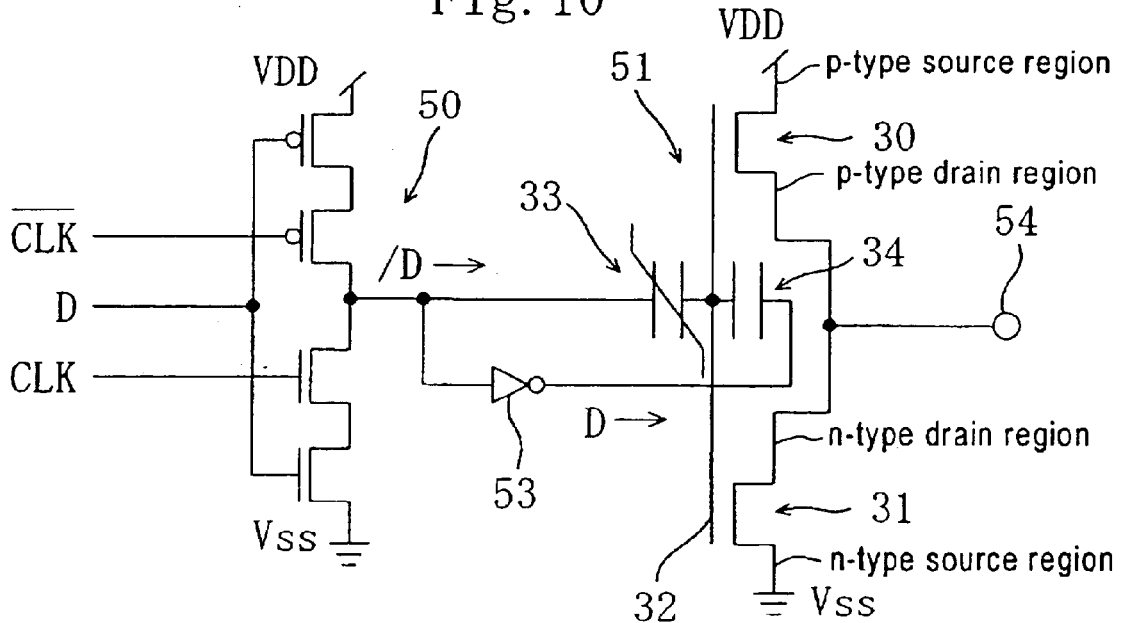
FIG. 10 is an equivalent circuit diagram of a nonvolatile logic element according to a modified example of the sixth embodiment of the present invention.
Figure 11:
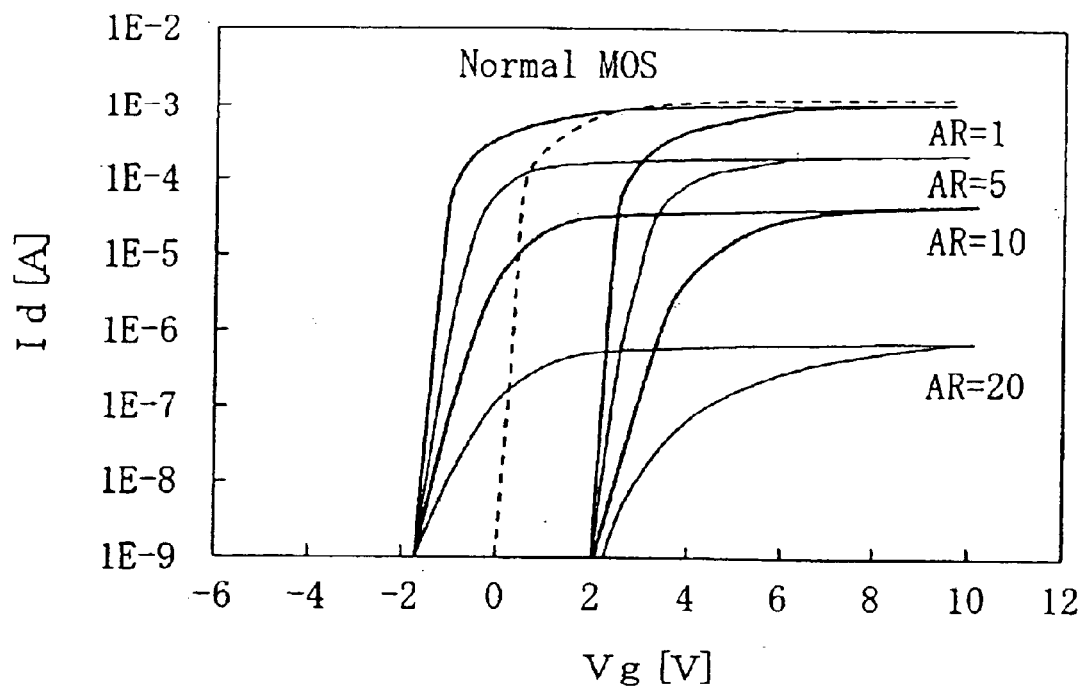
FIG. 11 is a graph showing the change in polarization properties depending on the capacitor area ratio of the drain current of an MFMISFET.
Figure 12:
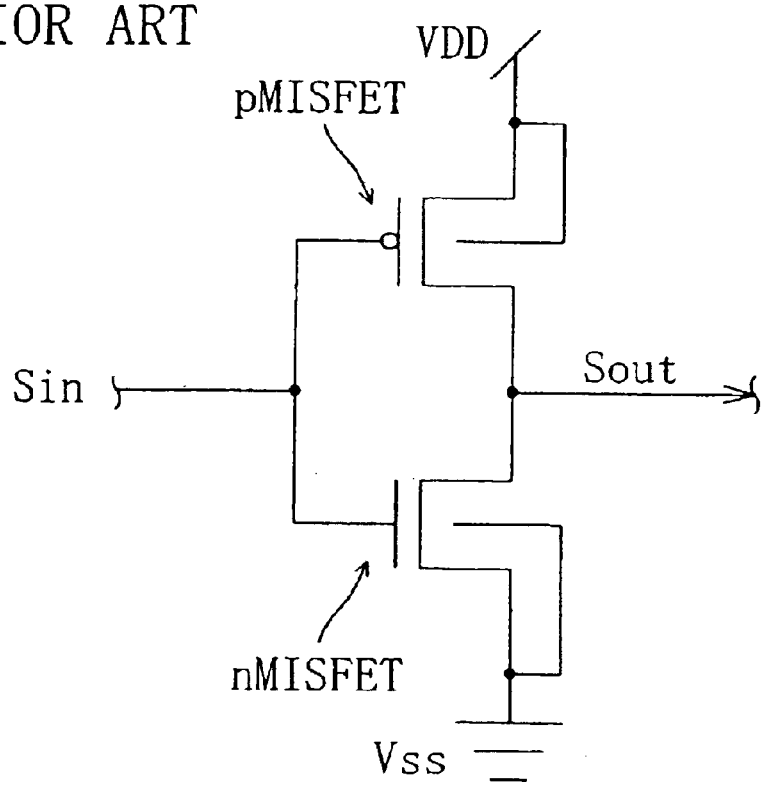
FIG. 12 is an equivalent circuit diagram of an ordinary inverter.
Figure 13:
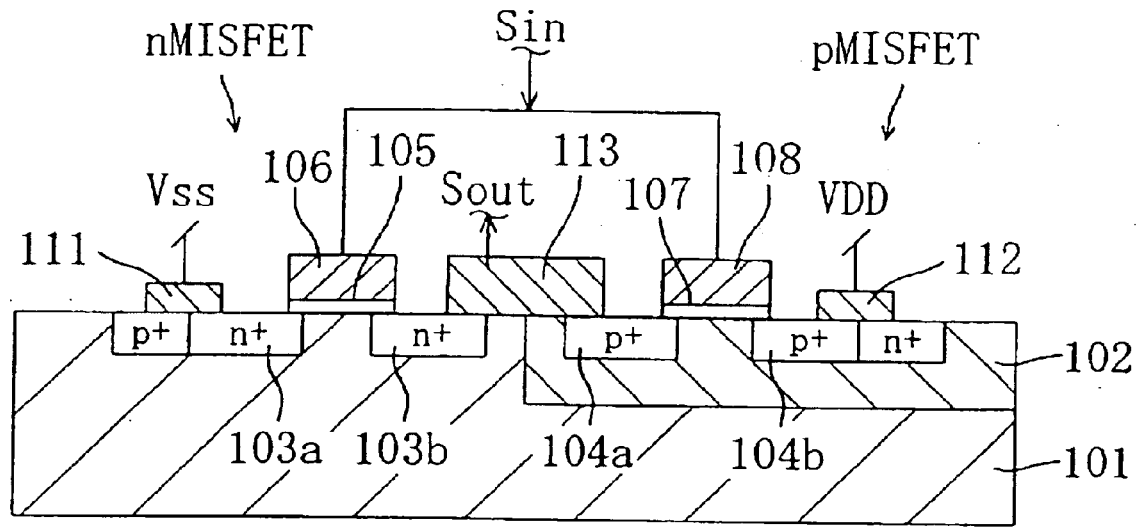
FIG. 13 is a schematic cross-sectional view showing a cross-section of the structure of an ordinary inverter.

FIG. 10 is an equivalent circuit diagram of a nonvolatile logic element (nonvolatile flip-flop) according to a modified example of the sixth embodiment.

In this modified example, in addition to the structure shown in FIG. 9, an intermediate inverter 53 is further disposed on a line that branches off from the line on the output side of the first-stage inverter 50. The output of the intermediate inverter 53, that is, the data signal D, is applied to the dielectric capacitor 34, and the output of the first-stage inverter 50, that is, the reversed signal/D, is applied to the ferroelectric capacitor 33.

Consequently, the nonvolatile logic element of this modified example can exhibit basically the same operative effects as the logic element of the sixth embodiment. Additionally, with this modified example, only during output of the first-stage inverter 50 is writing to the second-stage nonvolatile inverter 51 performed reliably, so an accurate writing operation is achieved, and operation stability is increased.

Other Embodiments

It is possible to provide the third to sixth embodiments with the pass transistor 25 (see FIG. 4) of the second embodiment.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for driving a nonvolatile memory, the nonvolatile memory comprising:

a transistor having a source region, a drain region and a floating gate electrode;

a dielectric capacitor, which is connected to the floating gate electrode and has a dielectric layer;

a ferroelectric capacitor, which is connected to the floating gate electrode and has a ferroelectric layer;

first and second polarization voltage application terminals, which are connected to the dielectric capacitor and the ferroelectric capacitor, respectively, and which apply voltage for generating polarization to the ferroelectric capacitor; and a ground terminal and a power source voltage terminal connected to the source region and the drain region, respectively, wherein during writing, in accordance with the information "0" or "1" that is to be written, the voltage applied to the first and second polarization voltage application terminals is reversed between high and low.

2. The method for driving a nonvolatile memory according to claim 1, wherein during read-out, a read-out voltage is across the ground terminal and the power source voltage terminal.

* * * * *